US012374578B2

(12) United States Patent
Zhao et al.

(10) Patent No.: US 12,374,578 B2
(45) Date of Patent: Jul. 29, 2025

(54) SEMICONDUCTOR PROCESS DEVICE AND WAFER TRANSFER SYSTEM THEREOF

(71) Applicant: BEIJING NAURA MICROELECTRONICS EQUIPMENT CO., LTD., Beijing (CN)

(72) Inventors: Donghua Zhao, Beijing (CN); Yingjun Si, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 0 days.

(21) Appl. No.: 18/574,661

(22) PCT Filed: Jun. 21, 2022

(86) PCT No.: PCT/CN2022/100055
§ 371 (c)(1),
(2) Date: Oct. 7, 2024

(87) PCT Pub. No.: WO2023/273950
PCT Pub. Date: Jan. 5, 2023

(65) Prior Publication Data
US 2025/0062155 A1    Feb. 20, 2025

(30) Foreign Application Priority Data
Jun. 28, 2021 (CN) .......................... 202110718514.0

(51) Int. Cl.
*H01L 21/68* (2006.01)
*H01L 21/687* (2006.01)
*C23C 16/458* (2006.01)

(52) U.S. Cl.
CPC ........ *H01L 21/68785* (2013.01); *H01L 21/68* (2013.01); *H01L 21/68742* (2013.01); *C23C 16/4584* (2013.01)

(58) Field of Classification Search
CPC ............... H01L 21/06; H01L 21/68742; H01L 21/6838; H01L 21/67; H01L 21/677;
(Continued)

(56) References Cited

U.S. PATENT DOCUMENTS 7,108,471 B2 *   9/2006   Osuga ............... H01L 21/68714
                                                        414/222.01
11,697,184 B2 *  7/2023   Kashiwagi .............. B24B 41/06
                                                              451/6
(Continued)

FOREIGN PATENT DOCUMENTS

CN    102082109 A    6/2011
CN    103021919 A    4/2013
(Continued)

OTHER PUBLICATIONS

The World Intellectual Property Organization (WIPO) International Search Report for PCT/CN2022/100055 Sep. 1, 2022 7 Pages (including translation).

*Primary Examiner* — Mahdi H Nejad
(74) *Attorney, Agent, or Firm* — ANOVA LAW GROUP, PLLC

(57) ABSTRACT

A wafer transfer system includes a wafer tray and a wafer separation assembly. The wafer tray includes a tray body and a center tray, a tray hole is formed at a center of the tray body penetrating the tray body in a thickness direction, and the center tray is disposed in the tray hole and is detachably placed at the tray body. The wafer separation assembly includes a tray support mechanism and a lifting mechanism, the tray support mechanism is used to support the tray body, (Continued)

the lifting mechanism is used to lift the center tray in the tray hole and to return the center tray back into the tray hole.

13 Claims, 7 Drawing Sheets

(58) Field of Classification Search
CPC ............... H01L 21/68785; H01L 21/68; H01L 21/67742; C23C 16/4584; Y02P 70/50
See application file for complete search history.

(56) References Cited

U.S. PATENT DOCUMENTS

| | | | | |
|---|---|---|---|---|
| 12,074,400 | B1* | 8/2024 | Ow | H01L 21/6838 |
| 2008/0138175 | A1* | 6/2008 | Mitchell | H01L 21/67745 |
| | | | | 414/217 |
| 2009/0068851 | A1 | 3/2009 | Yoshikazu et al. | |
| 2014/0361480 | A1* | 12/2014 | Fox | G01R 31/2867 |
| | | | | 29/559 |
| 2015/0170942 | A1* | 6/2015 | Chhatre | H01L 21/70 |
| | | | | 29/450 |
| 2018/0090364 | A1 | 3/2018 | Moriyama et al. | |
| 2021/0032771 | A1* | 2/2021 | Bastke | C23C 16/4586 |
| 2023/0390878 | A1* | 12/2023 | Sekiya | B23Q 3/101 |

FOREIGN PATENT DOCUMENTS

| | | | |
|---|---|---|---|
| CN | 103594406 A | | 2/2014 |
| CN | 110828359 A | | 2/2020 |
| CN | 111627839 A | | 9/2020 |
| CN | 113539914 A | | 10/2021 |
| CN | 118231294 A | * | 6/2024 |
| JP | 2006278521 A | | 10/2006 |
| JP | 2010129764 A | | 6/2010 |
| JP | 2011181873 A | | 9/2011 |
| JP | 6618876 B2 | | 12/2019 |
| KR | 101303005 B | | 9/2013 |
| KR | 20240153180 A | * | 10/2024 |
| WO | 02103781 A1 | | 12/2002 |
| WO | WO-2008070004 A2 | * | 6/2008 ......... H01L 21/67265 |
| WO | 2016098510 A1 | | 6/2016 |

* cited by examiner

SEMICONDUCTOR PROCESS DEVICE AND WAFER TRANSFER SYSTEM THEREOF

CROSS-REFERENCE TO RELATED APPLICATIONS

This application is a national stage application of International Application No. PCT/CN2022/100055, filed on Jun. 21, 2022, which claims priority to Chinese Patent Application No. 202110718514.0, filed with the China National Intellectual Property Administration (CNIPA) on Jun. 28, 2021, the entire contents of all of which are incorporated herein by reference.

TECHNICAL FIELD

The present disclosure relates to the technical field of semiconductor process technology, and more particularly, to a wafer transfer system and a semiconductor process device including the wafer transfer system.

BACKGROUND

Epitaxial growth is the first process in the manufacturing of silicon carbide (SIC) power semiconductor devices. Unlike an epitaxial temperature of silicon epitaxy, which is 1000° C. to 1200° C., an epitaxial temperature of silicon carbide epitaxy is usually 1500° C. to 1800° C., and its growth time is generally longer. Under this condition, if an existing method of directly picking up wafers in a silicon epitaxy process is used in a silicon carbide epitaxy process, surface defects will increase. Therefore, it is necessary to take out an entire tray where the wafers are loaded, and then an operator uses a tweezer to manually pick and place the wafers. This process is not only inefficient, but also easy for fine particles to fall onto wafer surfaces during a pick-and-place process.

To solve this technical problem, a semiconductor process device that automatically transfers and takes out wafers is often used in the prior art to improve production efficiency and yield. In the semiconductor process device, a graphite tray is driven by gas to rotate during the process, and is raised or lowered by a lifting device to access the wafers after the process stops. However, in the prior art, a centering accuracy of the graphite tray often degrades after repeated rotations and lifting movements, resulting in degradation in a wafer pick-and-place accuracy. Moreover, manual adjustments are often performed to reset the graphite tray after the graphite tray shifts its position, which results in maintenance inefficiency and operation complexity.

Therefore, how to provide a wafer transfer system that can improve the wafer pick-and-place accuracy and the semiconductor process device maintenance efficiency has become an urgent technical problem to be solved in this field.

SUMMARY

The present disclosure provides a wafer transfer system and a semiconductor process device to improve the wafer picking and placing accuracy and the semiconductor process efficiency.

One aspect of the present disclosure provides a wafer transfer system in a semiconductor process device. The wafer transfer system includes a wafer tray and a wafer separation assembly. The wafer tray includes a tray body and a center tray, a tray hole is formed at a center of the tray body penetrating the tray body in a thickness direction, and the center tray is disposed in the tray hole and is detachably placed at the tray body. The wafer separation assembly includes a tray support mechanism and a lifting mechanism, the tray support mechanism is used to support the tray body, the lifting mechanism is used to lift the center tray in the tray hole and to return the center tray back into the tray hole.

Optionally, the wafer separation assembly further includes a plurality of position adjustment mechanisms, the plurality of position adjustment mechanisms are arranged around the wafer tray to push the tray body in multiple different radial directions, such that an axis of the central tray 21 coincides with an axis of the lifting mechanism.

Optionally, the tray support mechanism is also provided with a tray suction structure configured to attach to the tray body; and the wafer separation assembly further includes a rotation drive mechanism and a zero-point detection mechanism, the wafer tray also includes a zero-point indication structure, the zero-point detection mechanism is configured to detect the zero-point indication structure, the rotation drive mechanism is configured to drive the tray support mechanism to rotate and stop when the zero-point detection mechanism detects the zero-point indication structure.

Optionally, the tray hole is a stepped hole, a protruding portion is disposed at a side wall of the center tray, and the protruding portion rests on a step of the stepped hole.

Optionally, the tray suction structure includes an annular suction surface at the top to contact with a bottom surface of the tray body, the annular suction surface includes at least one suction groove, a suction passage is formed inside the tray suction structure, the tray support mechanism, and the lifting mechanism, at least one air inlet of the suction passage is formed on the annular suction surface to connect to the suction groove, the suction passage is used for sucking air from the suction groove to attach to the tray body when the annular suction surface contacts with the bottom surface of the tray body.

Optionally, the suction groove includes a plurality of suction grooves, the plurality of suction grooves are evenly distributed along a circumferential direction of the annular suction surface, a number of air inlets is the same as a number of suction grooves, and each suction groove is connected to each air inlet in a one-to-one correspondence; and each suction groove includes a plurality of arc-shaped grooves, the plurality of arc-shaped grooves are arranged at intervals along radial directions of annular suction surface, for each arc-shaped groove in each suction groove, the corresponding air inlet is directly connected to the arc-shaped groove, or is connected to the arc-shaped groove through a connection groove.

Optionally, the lifting mechanism includes a driving source, a distribution shaft, a guide rod, and a lifting member, a guide hole extending in the vertical direction is formed inside the distribution shaft, the guide rod is arranged in the guide hole, the lifting member is fixedly connected to the top of the guide rod, the driving source is used to drive the guide rod to reciprocate along the guide hole, such that the lifting member raises or lowers the center tray.

Optionally, a top end of a driving shaft of the driving source is a flat surface, a bottom end of the guide rod is a hemispherical surface, when the driving source drives the guide rod to reciprocate along the guide hole, the flat surface at the top end of the driving shaft contacts with the hemispherical surface at the bottom end of the guide rod.

Optionally, the lifting member includes a positioning plate and a plurality of lifting columns, the plurality of lifting columns are arranged on a top surface of the positioning plate, the top of each lifting column is provided with a lifting platform, and a bottom surface of the positioning plate is fixedly connected to a top end of the guide rod.

Optionally, each position adjustment mechanism includes a centering finger and a radial driving part, the radial driving part is used to push the tray body to reciprocate in a radial direction through the centering finger; and the tray body includes a tapered positioning surface on a side surface, each centering finger includes a positioning bevel at its tip, and when the centering finger pushes the tray body, the positioning bevel contacts with the tapered positioning surface.

Another aspect of the present disclosure provides a semiconductor process device. The semiconductor process device includes the disclosed wafer transfer system.

In the semiconductor process device provided by the present disclosure, the wafer tray includes a tray body and a center tray. A lifting mechanism of a wafer separation assembly lifts the center tray in the tray hole to indirectly lift the wafer, and returns the center tray back to the tray hole. That is, the raising and lowering of the center tray relative to the tray body are achieved. At the same time, because the tray body remains stationary during the raising and lowering of the center tray, it provides a centering function for the center tray and prevents the center tray from offsetting from the center. Thus, the wafer can be picked and placed without degrading the position accuracy of the wafer tray, the time of frequent calibration of the axis position of the wafer tray can be saved, the wafer picking and placing accuracy and semiconductor process efficiency can be improved.

BRIEF DESCRIPTION OF THE DRAWINGS

To more clearly illustrate the technical solution of the present disclosure, the accompanying drawings used in the description of the disclosed embodiments are briefly described below. The drawings described below are merely some embodiments of the present disclosure. Other drawings may be derived from such drawings by a person with ordinary skill in the art without creative efforts and may be encompassed in the present disclosure.

DETAILED DESCRIPTION OF THE EMBODIMENTS

In order to make the objectives, technical solutions, and advantages of the present disclosure clearer, the present disclosure will be further described in detail below with reference to the accompanying drawings. Obviously, the described embodiments are only some of the embodiments of the present disclosure, not all of the embodiments. Based on the embodiments of the present disclosure, all other embodiments obtained by those of ordinary skill in the art without creative efforts shall fall within the scope of the present disclosure.

Figure 1:
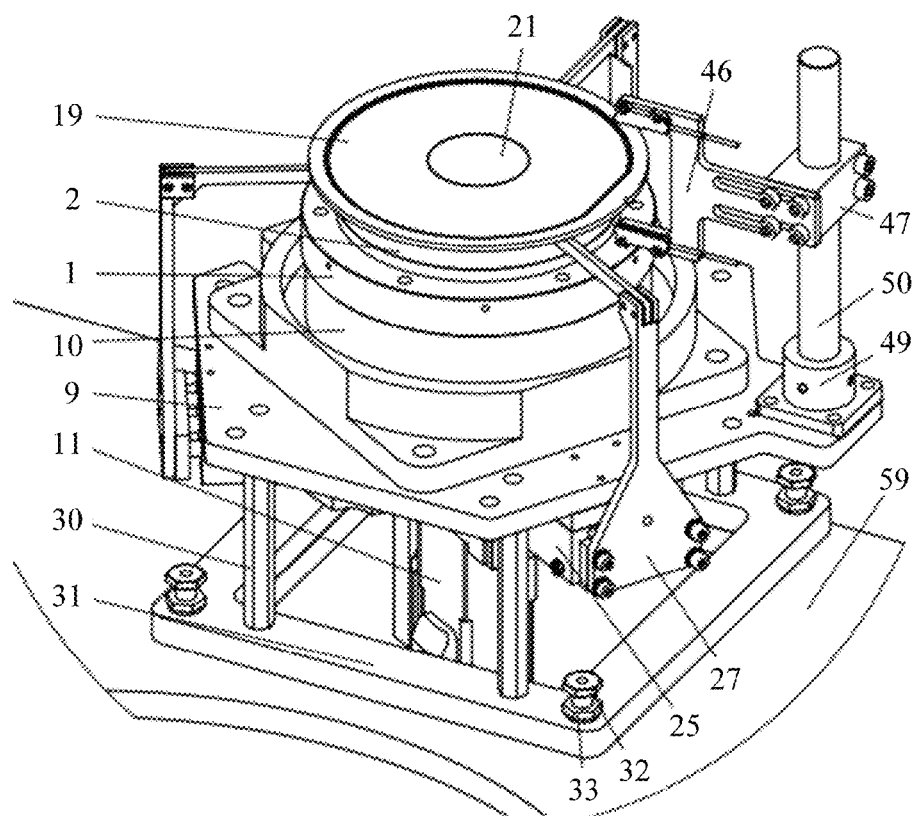
FIG. 1 is a schematic structural diagram of an exemplary wafer transfer system according to some embodiments of the present disclosure.

To solve the above technical problems, the present disclosure provides a wafer transfer system in a semiconductor process device. As shown in FIG. 1, the wafer transfer system includes a wafer tray (including a tray body 19 and a center tray 21) and a wafer separation assembly. The wafer tray includes a tray body 19 and a center tray 21. A tray hole is formed at a center of the tray body 19. The tray hole penetrates the tray body 19 in a thickness direction. The center tray 21 is disposed in the tray hole and is detachably placed at the tray body 19.

The wafer separation assembly includes a tray support mechanism and a lifting mechanism. The tray support mechanism is used to support the tray body 19. The lifting mechanism is used to lift the center tray 21 in the tray hole and to return the center tray 21 back into the tray hole.

In the wafer transfer system provided by the present disclosure, the wafer tray includes the tray body 19 and the center tray 21. The lifting mechanism of the wafer separation assembly lifts the center tray 21 in the tray hole to indirectly lift the wafer, and returns the center tray 21 back into the tray hole to replace the wafer. That is, the center tray 21 is raised and lowered relative to the tray body 19. At the same time, because the tray body 19 remains stationary during the raising and lowering of the center tray 21, the tray body 19 can play a role in controlling the wafer. A centering function of the center tray 21 prevents the center tray 21 from being offset, such that the wafer can be picked and placed without affecting the position accuracy of the wafer tray. Thus, time for frequent calibration of an axis position of the wafer tray is saved, and the wafer pick-and-place accuracy and semiconductor process efficiency are improved.

The embodiments of the present disclosure do not specifically limit shapes of the tray hole and the center tray 21. For example, to facilitate the center tray 21 to fall into the tray hole and to be automatically aligned with the tray hole under gravity of the center tray 21, the tray hole can be a variable-diameter hole whose diameter tends to decrease from top to bottom. For example, a side wall of the tray hole is a cone surface, or a spherical surface, etc.

Figure 2:
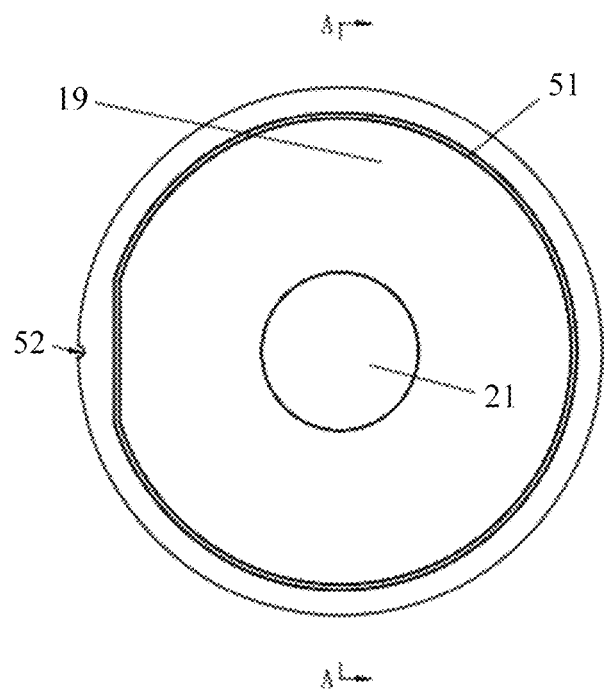
FIG. 2 is a schematic structural diagram of a wafer tray of an exemplary wafer transfer system according to some embodiments of the present disclosure.
Figure 3:
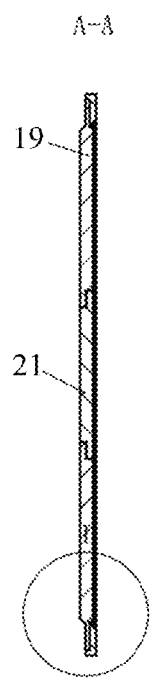
FIG. 3 is a cross-sectional view of the wafer tray in FIG. 2 along an A-A direction.
Figure 4:
FIG. 4 is a partial view of a circled portion in FIG. 3.

To ensure levelness of a support surface of the wafer tray (i.e., a surface formed by the support surface of the tray body 19 and a top surface of the center tray 21), as shown in FIG. 2 and FIG. 3, the tray hole is a stepped hole. The center tray 21 includes a protruding portion on its side wall, and the protruding portion rests on a step of the stepped hole. That is, the center tray 21 can be detachably placed on the tray body 19.

In some embodiments, the tray hole is the stepped hole, and the protruding portion on the side wall of the center tray 21 can rest on the step of the stepped hole, such that when the center tray 21 returns into the tray hole, the levelness of the center tray 21 is ensured by coupling between a bottom surface of the protruding portion of the center trays 21 and a top surface of the step of the stepped hole. Thus, the top surface of the center tray 21 is flush with the support surface of the tray body 19, thereby ensuring levelness of the wafer.

In some embodiments, the tray body 19 includes a positioning groove 51 on its top surface for placing the wafer. A contour of the positioning groove 51 corresponds to a peripheral contour of the wafer. When the center tray 21 is placed in the tray hole, its top surface is flush with the bottom surface of the positioning groove 51 (i.e., the support surface of the tray body 19).

To improve a calibration efficiency of calibrating the wafer tray position, as shown in FIG. 1, the wafer separation assembly also includes a plurality of position adjustment mechanisms (including centering fingers 27 and radial driving parts 25). The plurality of position adjustment mechanisms are arranged around the wafer tray to push the tray body 19 in multiple different radial directions, such that an axis of the central tray 21 coincides with an axis of the lifting mechanism. Thus, a position of the center tray 21 can be indirectly calibrated by calibrating a position of the tray body 19.

In some embodiments, the wafer separation assembly is also used to fix the wafer tray and drive the wafer tray to rotate after calibrating the wafer tray position. The present disclosure does not specifically limit how the wafer separation assembly fixes the wafer tray. For example, the tray support mechanism is also provided with a tray suction structure (including a suction cup mounting frame 1 and a suction ring 2). The tray suction structure is used to suck the tray body 19 to fix the position of the tray body 19 after the axis of the center tray 21 coincides with the axis of the lifting mechanism.

In the embodiments of the present disclosure, the wafer tray and the tray suction structure below are detachably connected. The multiple position adjustment mechanisms surrounding the wafer tray push the wafer tray toward the center from different radial directions, such that the wafer tray can be moved toward the center, such that an axis of the wafer tray is aligned with an axis of the wafer transfer system. After the alignment, the wafer tray can be sucked and fixed by the tray suction structure. Thus, after each semiconductor process is completed or the position of the wafer tray is offset, the tray suction structure can first stop sucking the wafer tray, and the position of the wafer tray can be automatically adjusted through the position adjustment mechanism until the axis of the center tray 21 coincides with the axis of the lifting mechanism, and then the wafer tray is sucked and fixed through the tray suction structure. As such, the position of the wafer tray can be automatically adjusted, and the position of the wafer tray can be automatically sucked or released. In addition to improving the wafer pick-and-place accuracy, the position of the wafer tray can be automatically adjusted and fixed, thereby improving maintenance efficiency.

To improve consistency of angles when picking up different wafers, as shown in FIG. 1 and FIG. 2, the wafer separation assembly also includes a rotation drive mechanism 10 and a zero-point detection mechanism. The wafer tray also includes a zero-point indication structure 52. The zero-point detection mechanism is configured to detect the zero-point indication structure. The rotation drive mechanism 10 is configured to drive the tray support mechanism to rotate and stop when the zero-point detection mechanism detects the zero-point indication structure. In other words, the zero-point detection mechanism is located on a movement path of the zero-point indication structure. When the rotation drive mechanism 10 drives the tray support mechanism to rotate, the zero-point detection mechanism detects the zero-point indication structure when it passes by and feeds back to the rotation drive mechanism 10, such that the rotation drive mechanism 10 stops the tray support mechanism at a current position, from which a zero-point position of the tray support mechanism is obtained.

In some embodiments, as shown in FIG. 1 and FIG. 2, the wafer tray also includes a positioning ring. The positioning ring is disposed on the top surface of the tray body 19 and includes the zero-point indication structure 52. The zero-point indication structure 52 may be, for example, a notch provided on an outer periphery of the positioning ring.

In some embodiments, the rotation drive mechanism 10 can drive the tray suction structure to rotate after the tray suction structure sucks the wafer tray until the zero-point indication structure 52 on the positioning ring is detected by the zero-point detection mechanism, thereby achieving a zero-point locating operation. Thus, before the semiconductor process and before a wafer pick-and-place operation, the zero-point locating operation can be performed to make the wafer face a specified direction, which improves consistency of the process between different wafers.

The present disclosure does not specifically limit the structure of the zero-point detection mechanism. For example, as shown in FIG. 1, the zero-point detection mechanism includes a guide shaft support 49, a guide shaft 50, a support fixing clip 47, and a sensor 46. The guide shaft support 49 (through fasteners, such as screws) is fixedly arranged at a corner of a tray mounting plate 9. The guide shaft support 49 includes a guide hole extending in a vertical direction. One end of the guide shaft 50 is inserted into the guide hole. The support fixing clip 47 is sleeved on the guide shaft 50. The sensor 46 is fixedly connected to the support fixing clip 47 through fasteners (such as screws).

Figure 5:
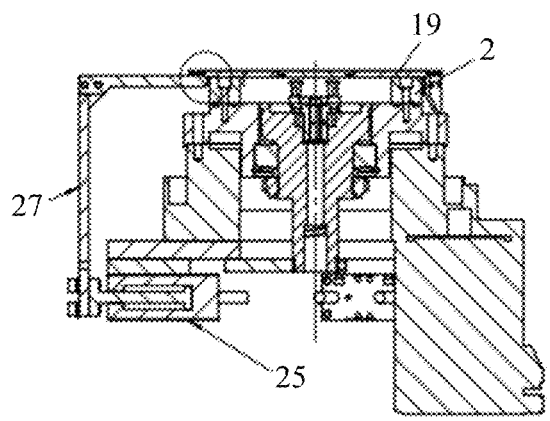
FIG. 5 is a schematic structural diagram showing an internal structure of an exemplary wafer transfer system according to some embodiments of the present disclosure.
Figure 12:
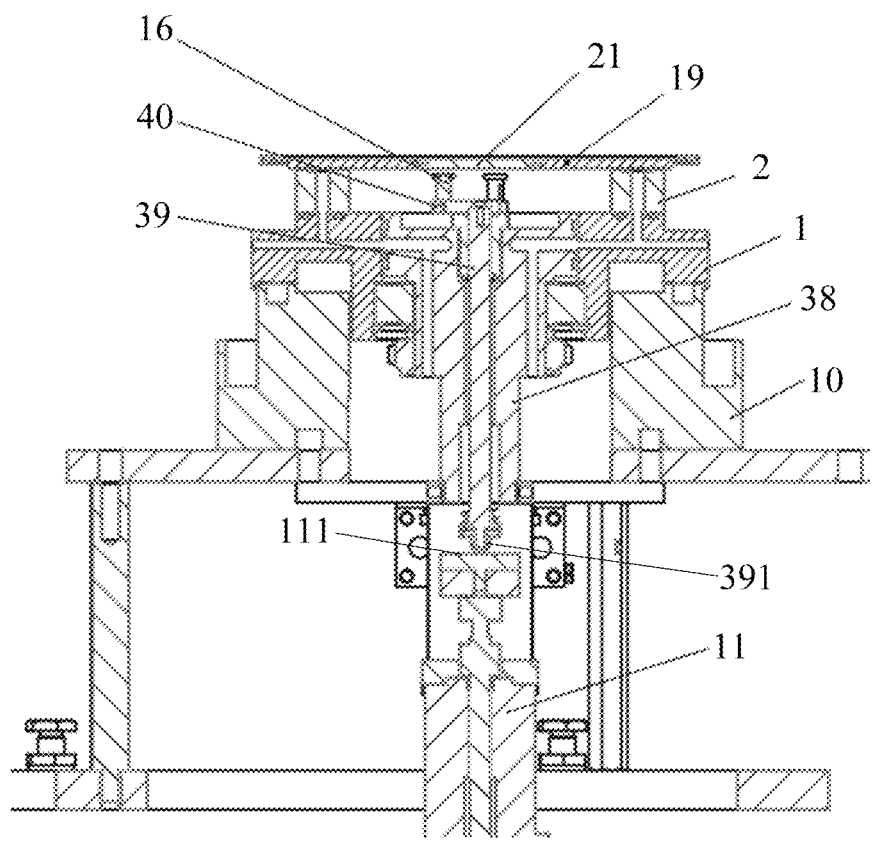
FIG. 12 is a cross-sectional view of an exemplary wafer transfer system according to some embodiments of the present disclosure.

In some embodiments, as shown in FIG. 1 and FIG. 12, the wafer transfer system also includes a rack. As shown in FIG. 5, the position adjustment mechanism includes a centering finger 27 and a radial driving part 25. The radial driving part 25 is provided on the frame and is used to push the tray body 19 to reciprocate in the radial directions through the centering finger 27. In some embodiments, the radial driving part 25 may be a cylinder, and straight lines of strokes of multiple cylinders (i.e., the radial directions) all pass through the axis of the wafer transfer system.

Figure 6:
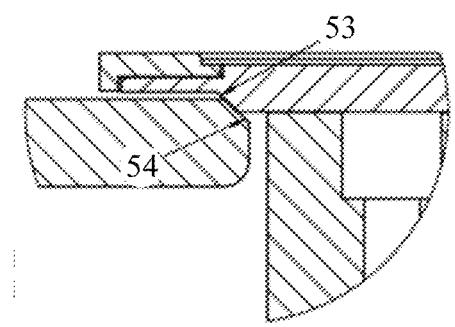
FIG. 6 is a partial view of a circled portion in FIG. 5.
Figure 7:
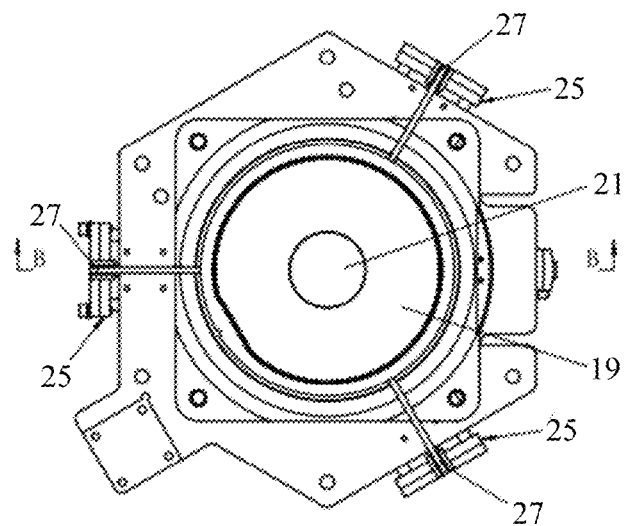
FIG. 7 is a top view of an exemplary wafer transfer system according to some embodiments of the present disclosure.
Figure 8:
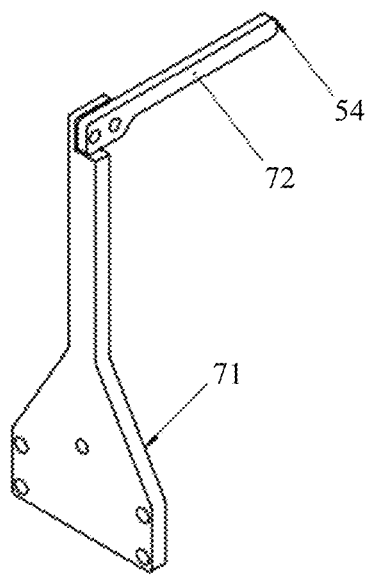
FIG. 8 is a schematic structural diagram of a centering finger in an exemplary wafer transfer system according to some embodiments of the present disclosure.

To improve safety of adjusting the position of the wafer tray, as shown in FIGS. 6-8, the tray body 19 includes a tapered positioning surface 53 on a side surface. An outer diameter of the tray body 19 at the tapered positioning surface 53 decreases from top to bottom. Each centering finger 27 includes a positioning bevel 54 at its tip. When the centering finger 27 pushes the tray body 19, the positioning bevel 54 contacts the tapered positioning surface 53. To ensure that the positioning bevel 54 and the tapered positioning surface 53 are completely coupled, an angle between the positioning bevel 54 and a horizontal plane is equal to an angle between a generatrix of the tapered positioning surface 53 and the horizontal plane.

In some embodiments, when the centering fingers 27 push the tray body 19, the positioning bevel 54 is in contact with the tapered positioning surface 53, such that when the tray body 19 gets stuck, the tray body 19 and the centering fingers 27 are staggered with each other along an inclined contact surface (i.e., the positioning bevel 54 and the tapered positioning surface 53), and the tray body 19 is temporarily lifted. Then, with a further push of the multiple centering fingers 27, the tray body 19 falls back between the centering fingers 27 under the gravity and resumes a horizontal state. Thus, the tray body 19 and the centering fingers 27 can be avoided to squeeze with each other when the tray body 19 gets stuck, and the safety of the tray body 19 and the adjustment accuracy of the position adjustment mechanism are improved.

To improve space utilization, as shown in FIG. 1 and FIG. 5, the rack includes a leveling mounting plate 31, the tray mounting plate 9, and a plurality of support columns 30. The leveling mounting plate 31 is used to fixedly connect to a platform 59 (e.g., a bottom wall of a process chamber) of the wafer transfer system that needs to be configured. A top surface of the leveling mounting plate 31 is fixedly connected to the tray mounting plate 9 through the plurality of support columns 30. The tray suction structure is arranged on a top surface of the tray mounting plate 9, and the radial driving parts 25 are arranged on a bottom surface of the tray mounting plate 9.

In some embodiments, the rack includes a floating tray mounting plate 9. The tray suction structure and the wafer tray are both arranged above the tray mounting plate 9. The radial driving parts 25 are arranged below the tray mounting plate 9. Thus, the space that the radial driving parts 25 need to move in the radial directions overlaps with the wafer tray in the vertical direction, thereby saving lateral space required for the wafer transfer system.

The present disclosure does not specifically limit the number of position adjustment mechanisms. For example, as shown in FIG. 7, the wafer transfer system may include three position adjustment mechanisms. To reasonably set the position of the position adjustment mechanisms, as shown in FIG. 1, the tray mounting plate 9 has a hexagonal shape, and the three radial driving parts 25 are respectively provided at one side of the tray mounting plate 9, and a stroke direction of each radial driving part 25 is perpendicular to the corresponding side of the tray mounting plate 9.

To ensure the levelness of the wafer tray, as shown in FIG. 1, the leveling mounting plate 31 is adjustably arranged on the platform 59 through adjustment bolts 32 and screws (not shown). When the leveling mounting plate 31 is arranged on the platform 59, the leveling mounting plate 31 is first leveled through the adjustment bolts 32 (make the leveling installation plate 31 parallel to the horizontal plane). Lock nuts (33) on the adjustment bolt 32 are then tightened. Then, the screws connecting the platform 59 and the leveling mounting plate 31 are tightened.

The present disclosure does not specifically limit the structure of the support column 30. For example, as shown in FIG. 1, the support column 30 may be a hexagonal column with an outer threaded section at one end and a threaded hole on an end face of the other end. When installing the rack, the end with the outer threaded section of each of the four support columns 30 is screwed into a threaded hole on the leveling mounting plate 31. Then, the other end of each of the four support columns 30 is tightened with the tray mounting plate 9 through screws.

The present disclosure does not specifically limit the structure of the centering finger 27. For example, as shown in FIG. 8, the centering finger 27 includes a vertical plate 71 and a finger portion 72. The vertical plate 71 is in the shape of an inverted funnel, including a connection section, a transition section, and a transfer section that are connected to each other from bottom to top. The connection section is used to be fixedly connected to an output shaft of the cylinder (through fasteners). A lower end width of the transition section corresponds to a width of the connection section, and an upper end width corresponds to a width of the transfer section. The width of the transfer section is smaller than the width of the connection section. An upper end of the transfer section includes a finger mounting surface perpendicular to the vertical plate 71. One end of the finger portion 72 is fixedly connected to the finger mounting surface (through a fastener), and the other end is used to contact a side of the tray body 19.

The present disclosure does not specifically limit the structure of the tray suction structure. For example, the tray suction structure may include multiple suction cups, and the multiple suction cups contact with a bottom surface of the tray body 19 and attach to it.

Figure 10:
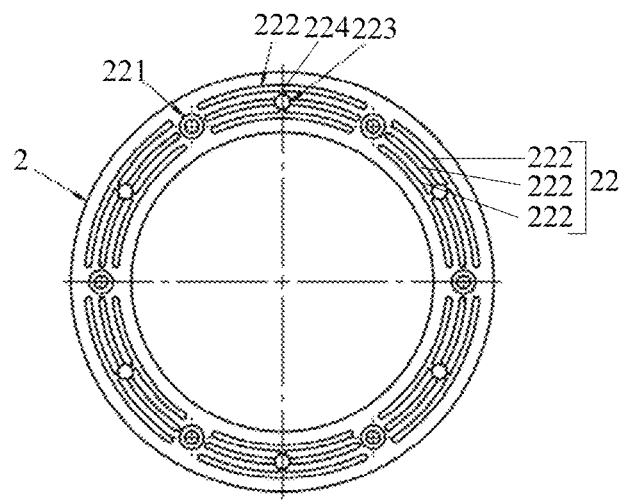
FIG. 10 is a schematic structural diagram showing an annular suction surface of a tray suction structure in an exemplary wafer transfer system according to some embodiments of the present disclosure.
Figure 11:
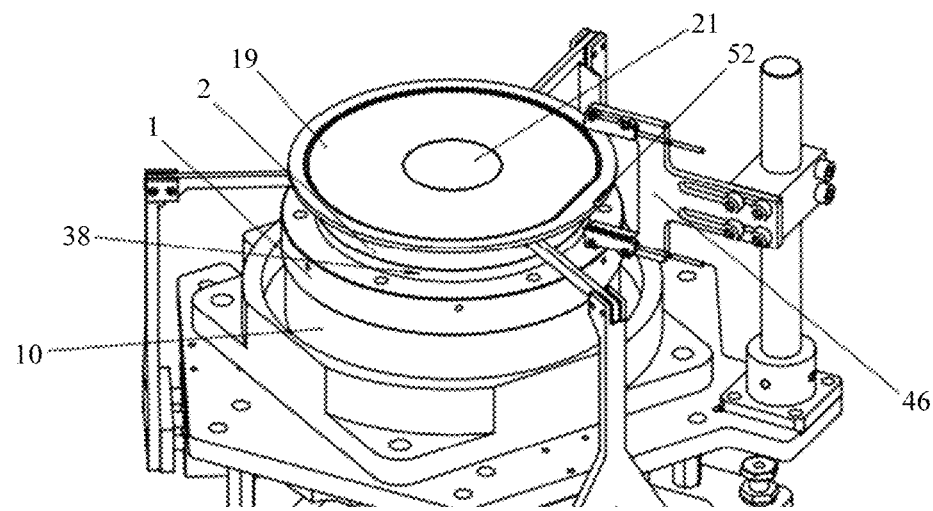
FIG. 11 is a schematic structural diagram of an exemplary wafer transfer system according to some embodiments of the present disclosure.

To further improve the centering accuracy of the wafer tray, as shown in FIG. 10, the tray suction structure includes an annular suction surface at the top to contact with the bottom surface of the tray body 19. The annular suction surface includes at least one suction groove 22. A suction passage is formed inside the tray suction structure, the tray support mechanism, and the lifting mechanism. At least one air inlet 223 of the suction passage is formed on the annular suction surface to connect to the suction groove 22. The suction passage is used for sucking air from the suction groove 22 to attach to the tray body 19 when the annular suction surface contacts with the bottom surface of the tray body 19.

In the embodiments of the present disclosure, the tray suction structure contacts with the bottom surface of the tray body 19 through a top plane (i.e., the annular suction surface), forms a suction cup structure through the suction groove on the annular suction surface, and sucks air from the suction passage to form a negative pressure for attachment. The tray suction structure and the tray body 19 may slide horizontally along a contact surface during non-suction time. Thus, resistance during the centering process of the wafer tray is reduced, and the accuracy of the position adjustment mechanism is improved in adjusting the position of the wafer tray.

To improve the accuracy of the tray suction structure in attaching the bottom surface of the tray body 19, as shown in FIG. 10, a plurality of suction grooves 22 are formed on the annular suction surface, and the plurality of suction grooves 22 are evenly distributed along a circumferential direction of the annular suction surface. A number of air inlets 223 is the same as a number of suction grooves 22. Each suction groove 22 is connected to each air inlet 223 in a one-to-one correspondence. The present disclosure does not specifically limit the number of suction grooves 22. For example, as shown in FIG. 10, six suction grooves 22 may be formed on the annular suction surface.

To further improve the accuracy of the tray suction structure to attach to the bottom surface of the tray body 19, as shown in FIG. 10, each suction groove 22 includes a plurality of arc-shaped grooves 222. The plurality of arc-shaped grooves 222 are arranged at intervals along the radial directions of annular suction surface. Each arc-shaped groove 222 extends along the circumferential direction of the annular suction surface. For each arc-shaped groove 222 in each suction groove 22, the corresponding air inlet 223 is directly connected to the arc-shaped groove 222, or is connected to the arc-shaped groove 222 through a connection groove 224. The present disclosure does not specifically limit the number of arc-shaped grooves 222 included in each suction groove 22. For example, as shown in FIG. 10, each suction groove 22 includes three arc-shaped grooves 222. The present disclosure does not specifically limit the way in which each air inlet 223 is connected to each arc-shaped groove 222 in each suction groove 22, as long as the air inlet 223 is connected to each arc-shaped groove 222. For example, as shown in FIG. 10, the air inlet 223 is directly connected to the middle arc-shaped slot 222 among the three arc-shaped grooves 222, and is connected to the remaining two arc-shaped grooves 222 through two connection grooves 224.

To improve space utilization efficiency, as shown in FIG. 12, the lifting mechanism includes a driving source 11, a distribution shaft 38, a guide rod 39, and a lifting member. A guide hole extending in the vertical direction is formed inside the distribution shaft 38. The guide rod 39 is arranged in the guide hole. The lifting member is fixedly connected to the top of the guide rod 39. The driving source 11 is used to drive the guide rod 39 to reciprocate along the guide hole, such that the lifting member raises or lowers the center tray 21.

To ensure the levelness and alignment accuracy of the center tray 21, as shown in FIG. 12, a top end of a driving shaft of the driving source 11 is a flat surface 111, and a bottom end of the guide rod 39 is a hemispherical surface 391. When the driving source 11 drives the guide rod 39 to reciprocate along the guide hole, the flat surface 111 contacts with the hemispherical surface 391.

In some embodiments, by making the flat surface 111 contact with the hemispherical surface 391, when the driving source 11 drives the guide rod 39 to reciprocate along the guide hole, it can be ensured that the driving source 11 always exerts an upward force on the guide rod 39. Even if an offset occurs between a transmission direction of the driving shaft of the driving source 11 and the vertical direction, it can still be ensured that the guide rod 39 moves in the vertical direction. Thus, the levelness and alignment accuracy of the center tray 21 are ensured. In some embodiments, the driving source 11 may include a lifting motor.

The present disclosure does not specifically limit how the top end of the guide rod 39 applies a lifting force to the center tray 21. For example, to improve uniformity of a contact force between the lifting member and the center tray 21 and stability of the center tray 21, as shown in FIG. 12, the lifting member includes a positioning plate 40 and a plurality of lifting columns 16. The plurality of lifting columns 16 are arranged on a top surface of the positioning plate 40. In some embodiments, to receive a uniform force, the plurality of lifting columns 16 are provided. The plurality of lifting columns 16 are evenly distributed relative to the top surface of the positioning plate 40. The top of each lifting column 16 is provided with a lifting platform for contacting with the bottom surface of the center tray 21. A bottom surface of the positioning plate 40 is fixedly connected to the top end of the guide rod 39.

The present disclosure does not specifically limit a shape of the positioning plate 40 and a number of lifting columns 16. For example, as an embodiment that is easy to implement and has a stable structure, as shown in FIG. 12, the lifting member includes three lifting columns 16. The positioning plate 40 has an (approximately) equilateral triangle shape. The three lifting columns 16 are respectively arranged at each corner of the positioning plate 40.

In some embodiments, the lifting member contacts with the bottom surface of the center tray 21 through a plurality of evenly arranged lifting columns 16, and the top end of each lifting column 16 has a flat lifting platform, which increases a contact area between each lifting column 16 and the center tray 21, thereby improving the stability of the center tray 21.

The present disclosure does not specifically limit a shape of the lifting platform, as long as the lifting platform has a surface that can stably contact with the bottom surface of the center tray 21. For example, the lifting platform may be in the shape of a cylinder. An outer diameter of the lifting platform is larger than an outer diameter of the lifting column 16, and the top surface of the lifting platform is formed into a circular contact surface for contacting with the bottom surface of the center tray 21.

Before the semiconductor process is carried out, the driving source 11 drives the guide rod 39 to move upward, such that the lifting columns 16 fixed on the guide rod 39 can lift up the center tray 21. After the wafer is placed on the center tray 21 before the process, the driving source 11 lowers the guide rod 39, causing the lifting columns 16 to drop and separate from the center tray 21. The center tray 21 falls into the tray hole again, and the wafer enters the positioning groove 51 on the tray body 19. After the semiconductor process is completed, the driving source 11 drives the guide rod 39 and the lifting columns 16 to move upward, and lifts the center tray 21 and the processed wafers thereon. After the post-process wafer is taken away and a next pre-process wafer is placed on the center tray 21, the driving source 11 lowers the guide rod 39 again to start the next round of process.

The present disclosure does not specifically limit how the lifting columns 16, the positioning plate 40, and the guide rod 39 are fixedly connected. For example, as shown in FIG. 12, the lifting columns 16, the positioning plate 40, and the guide rod 39 may be connected by fasteners (such as screws). Specifically, threaded holes may be formed at the bottom of the cylindrical part of each lifting column 16 and the end surface of the top of the guide rod 39, and a plurality of screws are passed through circular holes on the positioning plate 40 and threaded holes of the corresponding cylindrical parts of the plurality of lifting columns 16, respectively, to fix the to fix the plurality of lifting columns 16 to the positioning plate 40. Similarly, the positioning plate 40 is fixedly connected to the guide rod 39 through fasteners that sequentially pass through a circular hole in the center of the positioning plate 40 and a threaded hole at the top of the guide rod 39.

Figure 9:
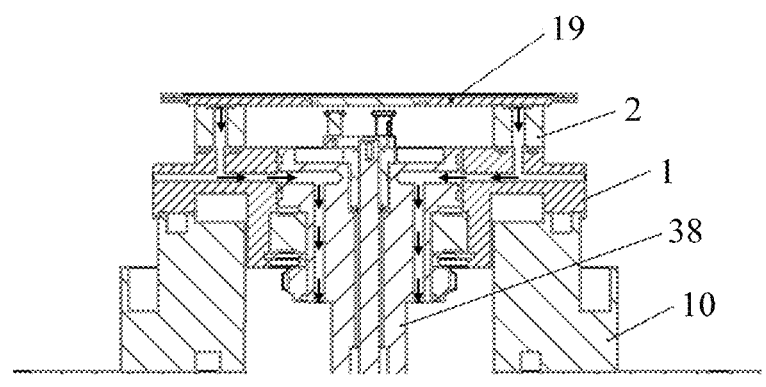
FIG. 9 is a schematic diagram showing airflow directions in suction passages in an exemplary wafer transfer system according to some embodiments of the present disclosure.

To facilitate lifting the center tray 21 from below the wafer tray, as shown in FIG. 9, the tray suction structure includes a suction cup mounting frame 1 and a suction ring 2 arranged on the top of the suction cup mounting frame 1. An annular suction surface is formed on a top surface of the suction ring 2. A bottom surface of the suction ring 2 is fixedly connected to the suction cup mounting frame 1. The suction passage is formed in the suction cup mounting frame 1, the distribution shaft 38, and the suction ring 2.

In some embodiments, the tray suction structure contacts with the bottom surface of the tray body 19 through the annular suction surface of the suction ring 2, such that a structure for lifting the center tray 21 can be provided in the area surrounded by the suction ring 2.

Figure 13:
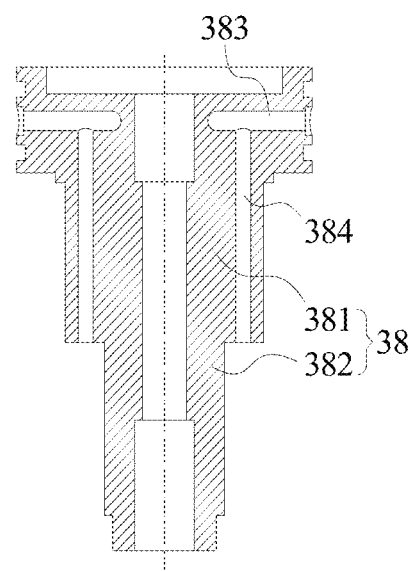
FIG. 13 is a schematic structural diagram of a distribution axis in an exemplary wafer transfer system according to some embodiments of the present disclosure.

The present disclosure does not specifically limit the suction passage structure inside the suction cup mounting frame 1 and the distribution shaft 38. For example, as shown in FIG. 9, FIG. 12, and FIG. 13, the distribution shaft 38 includes interconnected air duct section 381 and tail section 382. An outer diameter of the air duct section 381 is larger than an outer diameter of the tail section 382. The bottom of the suction cup mounting frame 1 is fixedly connected to the rotation drive mechanism 10, and the top is connected to the suction ring 2.

The suction passage includes a plurality of first vertical holes formed in the suction ring 2, a plurality of second vertical holes and a plurality of first horizontal holes formed in the suction cup mounting frame 1, and a plurality of second horizontal holes 383 and a plurality of third vertical holes 384 formed in air duct section 381 of the distribution shaft 38. A first end of each first vertical hole is formed as the air inlet 223 on the annular suction surface of the suction ring 2, and a second end penetrates vertically to the bottom surface of the suction ring 2 and is connected to an opening of the corresponding second vertical hole formed on the top of the suction cup mounting frame 1. Each second vertical hole extends downward and is connected to the corresponding first horizontal hole. To facilitate processing, each first horizontal hole is a through-hole extending inward from the outside of the suction cup mounting frame 1. An outward end of each first horizontal hole is sealed, and an inward end is connected to the corresponding second horizontal hole 383 in the air duct section 381. Each second horizontal hole 383 is a blind hole from the outside to the inside. One end of each third vertical hole 384 is connected to the corresponding second horizontal hole 383, and the other end extends to a step between the air duct section 381 and the tail section 382, and an air extraction hole is formed on the step.

The present disclosure does not specifically limit how to extract air through the suction passage and attach the tray body 19. For example, the wafer transfer system also includes an air extraction component (not shown), and inside the rotation drive mechanism 10 includes a sealed air extraction chamber. The air extraction component is used to extract the air in the suction passage through the air extraction chamber, such that a negative pressure is formed in the suction passage and the suction groove 22 to attach to the tray body 19 (the arrow in FIG. 9 indicates an airflow direction of airflow in the suction passage).

To improve air tightness of the suction passage, as shown in FIG. 9, the contact surfaces between the suction ring 2 and the suction cup mounting frame 1, and the contact surfaces between the suction cup mounting frame 1 and the distribution shaft 38 are sealed by gaskets.

The present invention does not specifically limit how the suction ring 2 is fixedly connected to the suction cup mounting frame 1. For example, the suction ring 2 may be fixedly connected to the suction cup mounting frame 1 through fasteners. Specifically, as shown in FIG. 10, the suction ring 2 is formed with a plurality of circular holes that penetrate the suction ring 2 in the vertical direction, and the suction cup mounting frame 1 is formed with a plurality of threaded holes at corresponding positions. A plurality of screws 221 sequentially pass through the plurality of circular holes and the plurality of corresponding threaded holes to fix the suction ring 2 to the suction cup mounting frame 1.

The present disclosure also provides a semiconductor process device. The semiconductor process device includes the wafer transfer system provided by the embodiments of the present disclosure.

In the semiconductor process device provided by the present disclosure, the wafer tray includes a tray body and a center tray. A lifting mechanism of a wafer separation assembly lifts the center tray in the tray hole to indirectly lift the wafer, and returns the center tray back to the tray hole. That is, the raising and lowering of the center tray relative to the tray body are achieved. At the same time, because the tray body remains stationary during the raising and lowering of the center tray, it provides a centering function for the center tray and prevents the center tray from offsetting from the center. Thus, the wafer can be picked and placed without degrading the position accuracy of the wafer tray, the time of frequent calibration of the axis position of the wafer tray can be saved, the wafer picking and placing accuracy and semiconductor process efficiency can be improved.

It should be understood that the above embodiments are merely exemplary embodiments adopted to illustrate the principles of the present disclosure, but the present disclosure is not limited thereto. For those of ordinary skill in the art, various modifications and improvements can be made without departing from the spirit and essence of the present disclosure, and these modifications and improvements are also regarded as the protection scope of the present disclosure.

What is claimed is:

1. A wafer transfer system in a semiconductor process device, comprising a wafer tray and a wafer separation assembly, wherein:
   the wafer tray includes a tray body and a center tray, a tray hole is formed at a center of the tray body penetrating the tray body in a thickness direction, and the center tray is disposed in the tray hole and is detachably placed at the tray body; and
   the wafer separation assembly includes a tray support mechanism and a lifting mechanism, the tray support mechanism is used to support the tray body, the lifting mechanism is used to lift the center tray in the tray hole and to return the center tray back into the tray hole, the tray support mechanism is also provided with a tray suction structure configured to suck the tray body to fix a position of the tray body after an axis of the center tray coincides with an axis of the lifting mechanism, wherein the wafer separation assembly further includes a plurality of position adjustment mechanisms, the plurality of position adjustment mechanisms are arranged around the wafer tray to push the tray body in multiple different radial directions, such that the axis of the center tray coincides with the axis of the lifting mechanism.

2. The wafer transfer system according to claim 1, wherein:
   the wafer separation assembly further includes a rotation drive mechanism and a zero-point detection mechanism, the wafer tray also includes a zero-point indication structure, the zero-point detection mechanism is configured to detect the zero-point indication structure, the rotation drive mechanism is configured to drive the tray support mechanism to rotate and stop when the zero-point detection mechanism detects the zero-point indication structure.

3. The wafer transfer system according to claim 2, wherein:
   the tray suction structure includes an annular suction surface at the top to contact with a bottom surface of the tray body, the annular suction surface includes at least one suction groove, a suction passage is formed inside the tray suction structure, the tray support mechanism, and the lifting mechanism, at least one air inlet of the suction passage is formed on the annular suction surface to connect to the suction groove, the suction passage is used for sucking air from the suction groove to attach to the tray body when the annular suction surface contacts with the bottom surface of the tray body.

4. The wafer transfer system according to claim 3, wherein:
the suction groove includes a plurality of suction grooves, the plurality of suction grooves are evenly distributed along a circumferential direction of the annular suction surface, a number of air inlets is the same as a number of suction grooves, and each suction groove is connected to each air inlet in a one-to-one correspondence; and
each suction groove includes a plurality of arc-shaped grooves, the plurality of arc-shaped grooves are arranged at intervals along radial directions of annular suction surface, for each arc-shaped groove in each suction groove, the corresponding air inlet is directly connected to the arc-shaped groove, or is connected to the arc-shaped groove through a connection groove.

5. The wafer transfer system according to claim 1, wherein:
the tray hole is a stepped hole, a protruding portion is disposed at a side wall of the center tray, and the protruding portion rests on a step of the stepped hole.

6. The wafer transfer system according to claim 1, wherein:
the lifting mechanism includes a driving source, a distribution shaft, a guide rod, and a lifting member, a guide hole extending in the vertical direction is formed inside the distribution shaft, the guide rod is arranged in the guide hole, the lifting member is fixedly connected to the top of the guide rod, the driving source is used to drive the guide rod to reciprocate along the guide hole, such that the lifting member raises or lowers the center tray.

7. The wafer transfer system according to claim 6, wherein:
a top end of a driving shaft of the driving source is a flat surface, a bottom end of the guide rod is a hemispherical surface, when the driving source drives the guide rod to reciprocate along the guide hole, the flat surface at the top end of the driving shaft contacts with the hemispherical surface at the bottom end of the guide rod.

8. The wafer transfer system according to claim 6, wherein:
the lifting member includes a positioning plate and a plurality of lifting columns, the plurality of lifting columns are arranged on a top surface of the positioning plate, the top of each lifting column is provided with a lifting platform, and a bottom surface of the positioning plate is fixedly connected to a top end of the guide rod.

9. The wafer transfer system according to claim 1, wherein:
each position adjustment mechanism includes a centering finger and a radial driving part, the radial driving part is used to push the tray body to reciprocate in a radial direction through the centering finger; and
the tray body includes a tapered positioning surface on a side surface, each centering finger includes a positioning bevel at its tip, an angle between the positioning bevel and a horizontal plane is equal to an angle between a generatrix of the tapered positioning surface and the horizontal plane, and when the centering finger pushes the tray body, the positioning bevel contacts with the tapered positioning surface.

10. A semiconductor process device, comprising a wafer transfer system in a semiconductor process device, the wafer transfer system comprising a wafer tray and a wafer separation assembly, wherein
the wafer tray includes a tray body and a center tray, a tray hole is formed at a center of the tray body penetrating the tray body in a thickness direction, and the center tray is disposed in the tray hole and is detachably placed at the tray body; and
the wafer separation assembly includes a tray support mechanism and a lifting mechanism, the tray support mechanism is used to support the tray body, the lifting mechanism is used to lift the center tray in the tray hole and to return the center tray back into the tray hole, the tray support mechanism is also provided with a tray suction structure configured to suck the tray body to fix a position of the tray body after an axis of the center tray coincides with an axis of the lifting mechanism, wherein the tray hole is a stepped hole, a protruding portion is disposed at a side wall of the center tray, and the protruding portion rests on a step of the stepped hole.

11. A wafer transfer system in a semiconductor process device, comprising a wafer tray and a wafer separation assembly, wherein:
the wafer tray includes a tray body and a center tray, a tray hole is formed at a center of the tray body penetrating the tray body in a thickness direction, and the center tray is disposed in the tray hole and is detachably placed at the tray body; and
the wafer separation assembly includes a tray support mechanism and a lifting mechanism, the tray support mechanism is used to support the tray body, the lifting mechanism is used to lift the center tray in the tray hole and to return the center tray back into the tray hole, the tray support mechanism is also provided with a tray suction structure configured to suck the tray body to fix a position of the tray body after an axis of the center tray coincides with an axis of the lifting mechanism,
wherein the lifting mechanism includes a driving source, a distribution shaft, a guide rod, and a lifting member, a guide hole extending in the vertical direction is formed inside the distribution shaft, the guide rod is arranged in the guide hole, the lifting member is fixedly connected to the top of the guide rod, the driving source is used to drive the guide rod to reciprocate along the guide hole, such that the lifting member raises or lowers the center tray.

12. The wafer transfer system according to claim 11, wherein:
a top end of a driving shaft of the driving source is a flat surface, a bottom end of the guide rod is a hemispherical surface, when the driving source drives the guide rod to reciprocate along the guide hole, the flat surface at the top end of the driving shaft contacts with the hemispherical surface at the bottom end of the guide rod.

13. The wafer transfer system according to claim 11, wherein:
the lifting member includes a positioning plate and a plurality of lifting columns, the plurality of lifting columns are arranged on a top surface of the positioning plate, the top of each lifting column is provided with a lifting platform, and a bottom surface of the positioning plate is fixedly connected to a top end of the guide rod.

* * * * *